United States Patent
Aharony

(10) Patent No.: US 10,396,826 B2
(45) Date of Patent: Aug. 27, 2019

(54) SOFTWARE DEFINED NETWORK WITH SELECTABLE LOW LATENCY OR HIGH THROUGHPUT MODE

(71) Applicant: Ahikam Aharony, Ottawa (CA)

(72) Inventor: Ahikam Aharony, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 93 days.

(21) Appl. No.: 15/478,798

(22) Filed: Apr. 4, 2017

(65) Prior Publication Data

US 2018/0115326 A1   Apr. 26, 2018

Related U.S. Application Data

(60) Provisional application No. 62/413,108, filed on Oct. 26, 2016.

(51) Int. Cl.
*H03M 13/37* (2006.01)
*H03M 13/00* (2006.01)
(Continued)

(52) U.S. Cl.
CPC ..... *H03M 13/3707* (2013.01); *H03M 13/005* (2013.01); *H03M 13/09* (2013.01);
(Continued)

(58) Field of Classification Search
CPC ......... H03M 13/3707; H03M 13/2933; H03M 13/2927; H03M 13/2909; H03M 13/2906; H03M 13/29
See application file for complete search history.

(56) References Cited

U.S. PATENT DOCUMENTS 5,875,202 A * 2/1999 Venters ................. H04L 1/0057
714/752
6,202,189 B1 * 3/2001 Hinedi ................. H03M 13/27
714/786
(Continued)

FOREIGN PATENT DOCUMENTS

CN    1881477 A       12/2006
WO    2000065764 A1   11/2000

OTHER PUBLICATIONS

Altera Corporation, "3GPP LTE Turbo Reference Design", https://www.altera.com/content/dam/altera-www/global/en_US/pdfs/literature/an/an505.pdf, Jan. 2011, pp. 1-26.
(Continued)

*Primary Examiner* — Steve N Nguyen

(57) ABSTRACT

Encoding and decoding systems are provided for reduced latency at the decoder. In the encode error detection codewords are produced from source bits. The error detection codewords are then encoded with a systematic error correction encoder to produce a set of parity bits. All of the systematic code source bits and at least some of the parity bits are mapped to modulation symbols for transmission. In the decoder, two signal processings are performed in parallel, one based on soft bit decisions and the other based on hard bit decisions. The soft bit decisions are processed using a systematic error correction decoder. The hard bit decisions are processed by re-encoding error detection codewords to produce parity bits. If the produced parity bits match received parity bits, then the hard bit decisions are reliable and are output without waiting for the result of the systematic error correction decoder.

11 Claims, 10 Drawing Sheets

(51) Int. Cl.
*H03M 13/09* (2006.01)
*H03M 13/11* (2006.01)
*H04L 1/00* (2006.01)
*H03M 13/29* (2006.01)

(52) U.S. Cl.
CPC .... *H03M 13/1108* (2013.01); *H03M 13/1111* (2013.01); *H03M 13/3738* (2013.01); *H03M 13/3776* (2013.01); *H03M 13/6362* (2013.01); *H03M 13/6502* (2013.01); *H04L 1/0041* (2013.01); *H04L 1/0045* (2013.01); *H04L 1/0058* (2013.01); *H04L 1/0061* (2013.01); *H03M 13/2906* (2013.01); *H03M 13/2927* (2013.01)

(56) References Cited

U.S. PATENT DOCUMENTS

| | | | |
|---|---|---|---|
| 7,007,223 | B2 | 2/2006 | Boyanapalli |
| 7,539,187 | B2 | 5/2009 | Fellman et al. |
| 8,078,936 | B2 * | 12/2011 | Yamagishi ........... H03M 13/116 714/755 |
| 8,429,498 | B1 * | 4/2013 | Anholt ................ G06F 11/1048 365/227 |
| 9,432,053 | B1 | 8/2016 | Graumann et al. |
| 9,735,940 | B1 * | 8/2017 | Bakr ..................... H04L 5/0053 |
| 2005/0044468 | A1 * | 2/2005 | Izumita ............ G11B 20/10009 714/763 |
| 2005/0215274 | A1 * | 9/2005 | Matson ................. G06F 1/3203 455/522 |
| 2007/0011598 | A1 | 1/2007 | Hassner et al. |
| 2007/0016839 | A1 * | 1/2007 | Chiou ............... H03M 13/3707 714/774 |
| 2008/0240273 | A1 | 10/2008 | Akita |
| 2009/0199073 | A1 * | 8/2009 | Kanaoka ............ G11B 20/1833 714/758 |
| 2009/0282319 | A1 * | 11/2009 | No ..................... H03M 13/1108 714/780 |
| 2012/0124455 | A1 * | 5/2012 | Koshisaka ........ H03M 13/2915 714/799 |
| 2013/0132804 | A1 * | 5/2013 | Frayer ................. G06F 11/1012 714/780 |
| 2015/0341056 | A1 * | 11/2015 | Evain .................. H03M 13/453 714/753 |
| 2017/0279560 | A1 * | 9/2017 | Murakami ......... H03M 13/1125 |

OTHER PUBLICATIONS

Matache, et al, "Stopping Rules for Turbo Decoders", TMO Progress Report 42-142, https://ipnpr.jpl.nasa.gov/progress_report/42-142/142J.pdf, Aug. 15, 2000, pp. 1-22.

Avago Technologies, "Partial FEC", P802.3ba Dallas Nov. 2008, http://www.ieee802.org/3/ba/public/nov08/dawe_02_1108.pdf, pp. 1-10.

Geldmacher, et al., "Hard Decision Based Low SNR Early Termination for LTE Turbo Decoding", Information Processing Lab, TU Dortmund University, http://www.dt.e-technik.tu-dortmund.de/publikationen/iswcs2011_jan.pdf, p. 1-5.

Stoye, William, "LDPC Iteration Control by Partial Parity Check", ICUWB 2009 (Sep. 9-11, 2009), pp. 602-605.

* cited by examiner

SOFTWARE DEFINED NETWORK WITH SELECTABLE LOW LATENCY OR HIGH THROUGHPUT MODE

CROSS REFERENCE TO RELATED APPLICATION

This application claims priority to U.S. Provisional Patent Application No. 62/416,108 filed Oct. 26, 2016.

FIELD

The application relates to software defined networks, and to systematic error correction block encoders and decoders.

BACKGROUND

A low density parity check (LDPC) code is a systematic code in that the encoding process adds parity bits and does not change the source bits. The encoder delay can be zero delay for the source bits in that the source bits can appear at the output of the encoder, as they are received. The encoder delay for the parity bits is small, for example 64 clock cycles to calculate the first parity bit after the last source bit. The combination of the source bits and the parity bits is referred to as an LDPC block. FIG. 1 shows an example of the encoder output for two blocks of source bits 100,102 at the encoder input referred to as block N and block N+1. The encoder output includes block N 100, block N parity bits 104, block N+1 102, and block N+1 parity bits.

However, the decoder delay is at least one full LDPC block. This is due to the fact that LDPC decoding cannot start before the last bit of the block is received. For example, in an LDPC code implementation in which LDPC blocks contain 8k bits, the decoding latency will always be larger than the time it takes to receive the full 8k LDPC block. Furthermore, the decoding process often requires many iterations which may take additional time.

FIG. 2 shows an example of the decoder latency for the two blocks of source bits 100,102 and the two blocks of parity bits 104,106 introduced with reference to FIG. 1. For the decoding process for block N 100 to begin, the decoder must receive all the bits of the block, and the decoding process may take more time up to another block duration or longer. In the illustrated example, the decoded block N 110 is not available until the bits of block N+1 102 have also been received. The decoder latency is indicated at 120.

SUMMARY

According to one aspect of the present invention, there is provided a method comprising: generating a plurality of error detection codewords by, for each of a plurality of sets of source bits, encoding the set of source bits with an error detection encoder to produce an error detection codeword, the error detection codeword containing the set of source bits and a set of error detection bits; encoding a set of systematic code source bits with a systematic error correction encoder to produce a set of parity bits, the set of systematic code source bits consisting of the plurality of error detection codewords; mapping all of the systematic code source bits and at least some of the parity bits to modulation symbols; transmitting the modulation symbols.

Optionally, encoding each set of source bits to produce the set of error detection bits comprises computing a checksum on the set of source bits.

Optionally, encoding each set of source bits to produce the set of error detection bits comprises computing a cyclic redundancy check on the set of source bits.

Optionally, encoding the set of systematic code source bits with the systematic error correction encoder comprises encoding the set of systematic code source bits with a low density parity check (LDPC) encoder.

Optionally, the plurality of error detection codewords comprises at least 8 error detection codewords.

Optionally, mapping all of the systematic code source bits and at least some of the parity bits to modulation symbols comprises mapping all of the systematic code source bits and all of the parity bits to modulation symbols.

Optionally, the method further comprises puncturing the set of parity bits to produce a reduced set of parity bits; wherein mapping all of the systematic code source bits and at least some of the parity bits to modulation symbols comprises mapping all of the systematic code source bits and the reduced set of parity bits to modulation symbols.

According to another aspect of the present invention, there is provided a system comprising: an error detection encoder for generating a plurality of error detection codewords by, for each of a plurality of sets of source bits, encoding the set of source bits with an error detection encoder to produce an error detection codeword, the error detection codeword containing the set of source bits and a set of error detection bits; a systematic error correction block code encoder for encoding a set of systematic code source bits with a systematic error correction encoder to produce a set of parity bits, the set of systematic code source bits consisting of the plurality of error detection codewords; a mapper for mapping all of the systematic code source bits and at least some of the parity bits to modulation symbols.

Optionally, the system further comprises a transmitter transmitting the modulation symbols.

Optionally, the systematic error correction block code encoder comprises a low density parity check (LDPC) encoder.

Optionally, the system further comprises a puncture for puncturing the set of parity bits to produce a reduced set of parity bits; wherein the mapper maps all of the systematic code source bits and at least some of the parity bits to modulation symbols by mapping all of the systematic code source bits and the reduced set of parity bits to modulation symbols.

According to another aspect of the present invention, there is provided a method comprising: receiving a signal carrying a coded data block comprising a set of systematic code source bits and a set of parity bits of a systematic error correction code, the set of systematic code source bits including a plurality of error detection codewords, each error detection codeword including a set of source bits and a set of error correction bits; performing a first signal processing on the received signal by: processing the received signal to produce a set of soft bit decisions, the set of soft bit decisions including soft decisions for the set of systematic code source bits and for the set of parity bits; performing error correction decoding of the set of soft bit decisions to determine decoded systematic code source bits including decoded source bits and decoded error detection bits for the plurality of error detection codewords; in parallel with performing the first signal processing, performing a second signal processing on the received signal by: for each error detection codeword: processing the received signal to produce a set of hard bit decisions for the error detection codeword, the set of hard bit decisions including a received set of source bits and a received set of error detection bits; re-encoding the received set of source bits to produce a set of error detection bits; comparing the received set of error detection bits with the produced set of error detection bits and determining whether the received set of source bits is reliable based on a result of the comparison; if the received set of source bits is determined to be reliable, outputting the received set of source bits without waiting for a final result of the first signal processing; if the received set of source bits is determined not to be reliable, outputting the decoded source bits after completing the first signal processing.

Optionally, for each error detection codeword: re-encoding the received set of source bits to produce a set of error detection bits comprises computing a checksum on the received set of source bits; and determining whether the received set of source bits is reliable based on a result of the comparison comprises: determining the received set of source bits is reliable when the received error detection bits are the same as the produced set of error detection bits; and determining the received set of source bits is not reliable when the received error detection bits are not the same as the produced set of error detection bits.

Optionally, computing a checksum comprises computing a cyclic redundancy checksum on the received set of source bits.

Optionally, performing error correction decoding comprises performing low density parity check (LDPC) decoding.

Optionally, the method further comprises as part of the first signal processing, prior to performing error correction decoding, inserting soft decisions corresponding to punctured parity bits.

Optionally, the plurality of error detection codewords comprises at least 8 error detection codewords.

According to another aspect of the present invention, there is provided a method comprising: setting each link of a plurality of links in a software defined network to be in a low latency mode or a high throughput mode; performing the method of claim 12 is for each link that is in low latency mode.

Optionally, the method further comprises for a given signal to noise ratio, using a lower modulation for low latency mode than for high throughput mode.

According to another aspect of the present invention, there is provided a receiver, decoder, base station or other network element configured to implement any of the methods describe above.

According to another aspect of the present invention, there is provided a system comprising: a receiver for receiving a signal carrying a coded data block comprising a set of systematic code source bits and a set of parity bits of a systematic error correction code, the set of systematic code source bits including a plurality of error detection codewords, each error detection codeword including a set of source bits and a set of error correction bits; a first signal processor for performing a first signal processing on the received signal, the first signal processor comprising: a soft decision generator for processing the received signal to produce a set of soft bit decisions, the set of soft bit decisions including soft decisions for the set of systematic code source bits and for the set of parity bits;

an error correction decoder for performing error correction decoding of the set of soft bit decisions to determine decoded systematic code source bits including decoded source bits and decoded error detection bits for the plurality of error detection codewords; a second signal processor for performing a second signal processing on the received signal in parallel with said first signal processing, the second signal processor comprising: a hard decision generator for processing the received signal to produce a set of hard bit decisions for the error detection codeword, the set of hard bit decisions including for each error detection codeword a received set of source bits and a received set of error detection bits; an error detector that for each error detection codeword re-encodes the received set of source bits to produce a set of error detection bits, and that compares the received set of error detection bits with the produced set of error detection bits and determining whether the received set of source bits is reliable based on a result of the comparison; a selector that, if the received set of source bits is determined to be reliable, outputs the received set of source bits without waiting for a final result of the first signal processing, and that, if the received set of source bits is determined not to be reliable, outputs the decoded source bits after completing the first signal processing.

Optionally, the error correction block code decoder is an low density parity check (LDPC) decoder.

Optionally, the first signal processor further comprises: a depuncturer that, as part of the first signal processing, prior to performing error correction decoding, inserts soft decisions corresponding to punctured parity bits.

BRIEF DESCRIPTION OF THE DRAWINGS

Embodiments of the disclosure will now be described with reference to the attached drawings in which.

DETAILED DESCRIPTION

Figure 1:
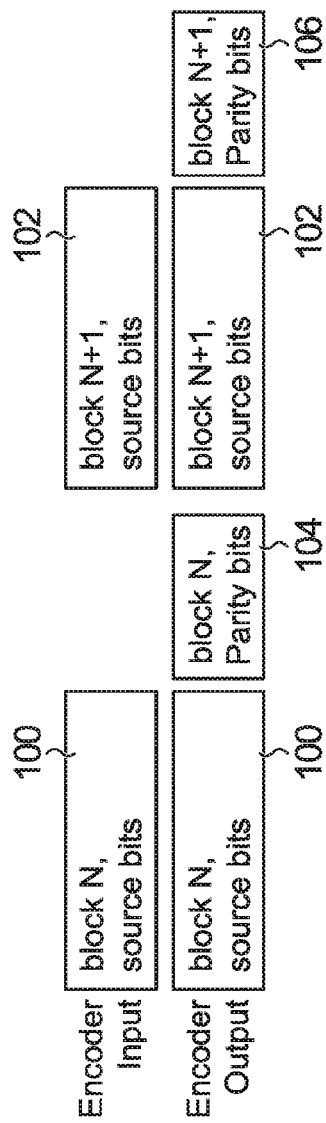
FIG. 1 is an example of LDPC encoder output for two blocks of source bits.
Figure 2:
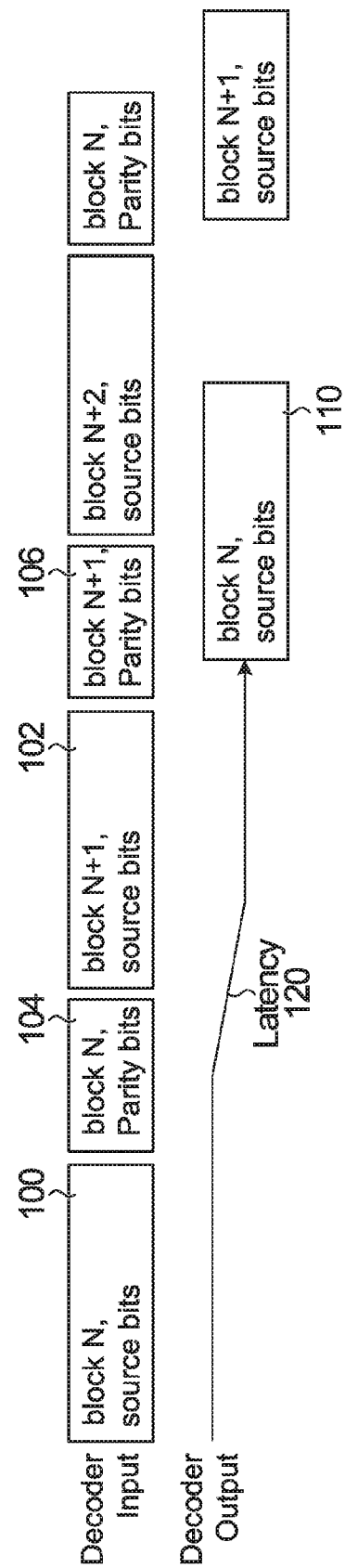
FIG. 2 is an example of decoder latency in a decoder that decodes the two blocks of source bits of FIG. 1.

Generally, embodiments of the present disclosure provide a method and system for encoding/decoding systematic error correction block codes with improved latency. In some embodiments, these are applied in a software defined network to provide selectable low latency or high throughput mode for a given link within the software defined network. For simplicity and clarity of illustration, reference numerals may be repeated among the figures to indicate corresponding or analogous elements. Numerous details are set forth to provide an understanding of the examples described herein. The examples may be practiced without these details. In other instances, well-known methods, procedures, and components are not described in detail to avoid obscuring the examples described. The description is not to be considered as limited to the scope of the examples described herein.

Figure 3A:
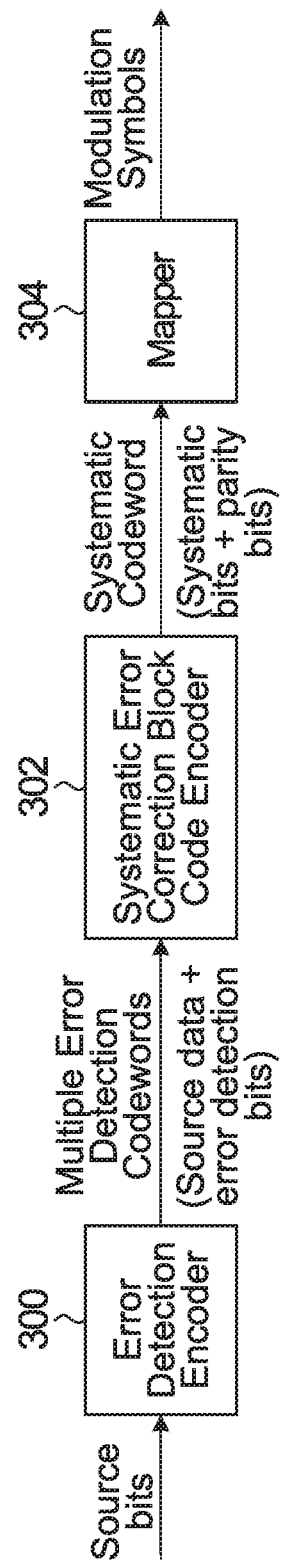
FIG. 3A is a block diagram of an encoding system provided by an embodiment of the invention.

FIG. 3A shows a block diagram of an encoding system provided by an embodiment of the invention. Further embodiments provide transmitters equipped with such an encoding system, for example as part of a network element such as a base station, or as part of a user equipment such as a mobile device. The encoding system includes an error detection encoder 300, a systematic error correction block code encoder 302, and a mapper 304 connected together in sequence.

In operation, the error detection encoder 300 generates a set N of error detection codewords. The number N of error detection codewords is greater than one. In some embodiments, $N \geq 8$. The systematic error correction block code encoder 302 encodes a set of systematic code source bits to produce an error correction codeword containing the systematic code source bits and a set of parity bits. The set of systematic code source bits consists of the N error detection codewords. Thus, N error correction codewords go into the generation of one error correction codeword. Next, the mapper 304 maps the systematic code source bits and the parity bits to modulation symbols which are then available for transmission by a transmitter.

Figure 3B:
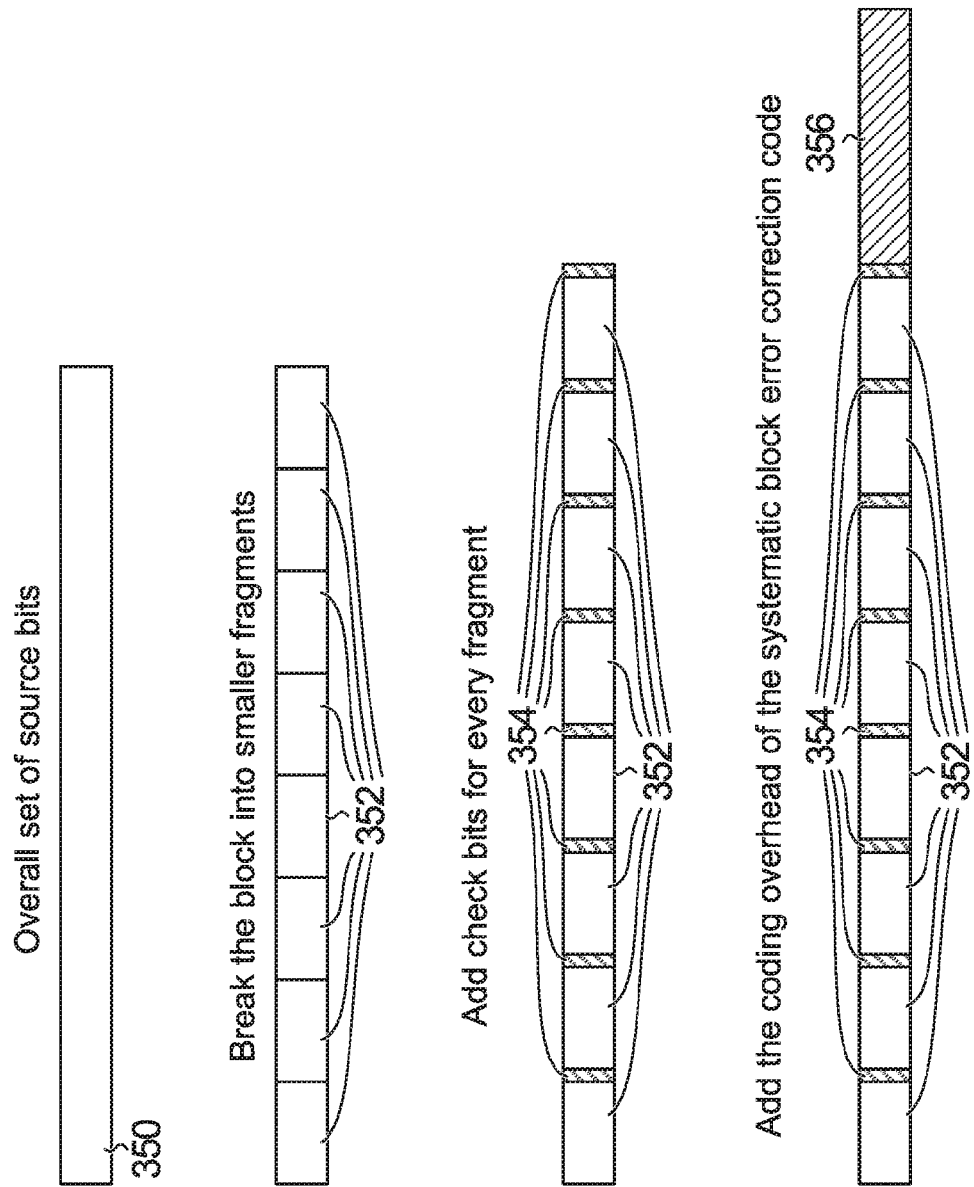
FIG. 3B shows bit sequences at various stages of encoding.

A graphical depiction of the operation of the encoding system of FIG. 3A will now be described with reference to FIG. 3B. The system starts with an overall set of source bits at 350. The overall set of source bits 350 is split into N smaller fragments at 352. In the illustrated example, N=8, but more generally, $N >= 2$. Each fragment is then encoded with the error detection encoder 300 to produce a respective error detection codeword containing source bits and error detect bits, and the result is an alternating sequence of source bits 352 and error detection bits 354. The alternating sequence then functions as the systematic input of the systematic error correction block code encoder 302 which adds parity bits as shown at 356.

In some embodiments, the error detection encoder 300 computes a checksum on each set of source bits/fragment. In a specific example, the checksum is a cyclic redundancy check.

In some embodiments, the systematic error correction block code encoder 302 is a low density parity check (LDPC) encoder.

Figure 3C:
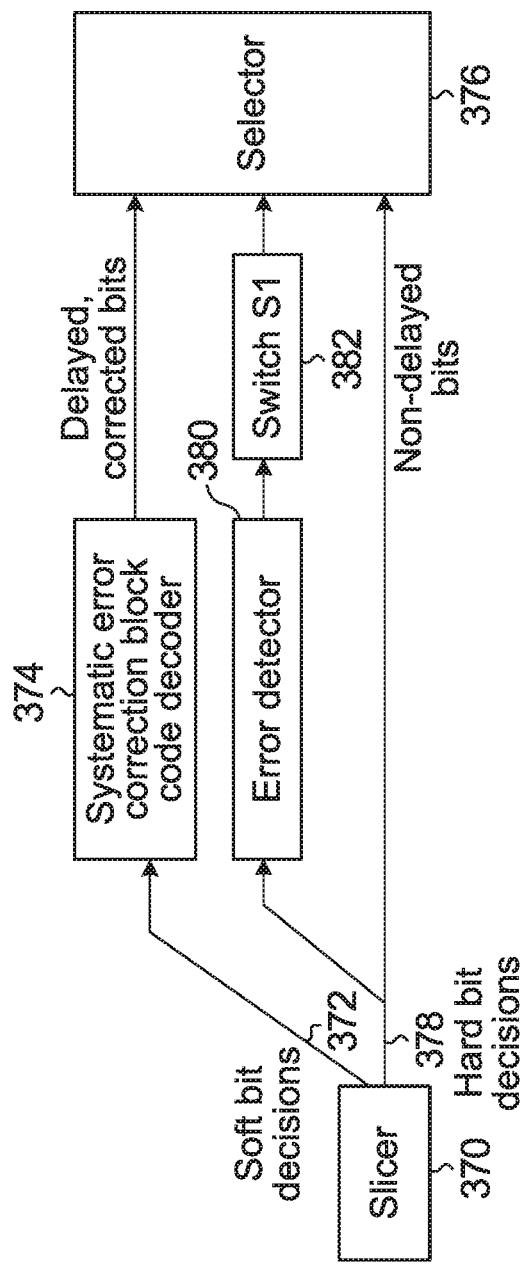
FIG. 3C is a block diagram of a decoding system provided by an embodiment of the invention.

Referring now to FIG. 3C, shown is a block diagram of a decoding system provided by an embodiment of the invention. This corresponds with the encoding system of FIG. 3A. Further embodiments provide receivers equipped with such a decoding system, for example as part of a network element such as a base station, or as part of a user equipment such as a mobile device.

The decoding system has a slicer 370 having a first output 372 connected to a systematic error correction block code decoder 374 which has an output connected to a selector 376. The slicer 370 has a second output 378 connected to error detector 380. The output of the error detector 380 is connected through a switch S1 382 to the selector 376. In addition, the second output 378 of the slicer 370 is also connected to the selector 376.

Operation of the decoding system begins with receipt of a signal carrying an error correction codeword produced as described above with reference to FIG. 3A. The received error correction codeword is subject to possible corruption by the channel. The error correction codeword has a set of systematic code source bits and a set of parity bits of a systematic error correction block code. As detailed previously, the set of systematic code source bits includes a set of N error detection codewords, and each error detection codeword includes a set of source bits and a set of error correction bits. The slicer 370 processes the received signal to produce a set of soft bit decisions for the set of systematic code source bits and for the set of parity bits which are output at 372, and to produce a corresponding set of hard bit decisions which are output at 378.

A first signal processing is performed by the systematic error correction block code decoder 374 which performs error correction decoding of the set of soft bit decisions to determine decoded systematic code source bits including decoded source bits and decoded error detection bits for the N error detection codewords. The delayed corrected bits are passed to the selector 376.

In parallel with the first signal processing, a second signal processing on the received signal is performed in the error detector 380. For each error detection codeword containing a received set of source bits and error detection bits, the error detector 380 re-encodes the received set of source bits to produce a set of error detection bits. The error detector 380 then compares the received set of error detection bits with the produced set of error detection bits and determines whether the received set of source bits is reliable based on a result of the comparison. Specific examples are given below. If the received set of source bits is determined to be reliable, then the received set of source bits is output without waiting for a final result of the first signal processing. This is achieved by the hard bit decisions 378 being selected by switch 51 382 to be output by selector 376 if the output of error detector 380 is that the source bits are reliable. Otherwise switch S1 382 controls selector 376 to select the output of the systematic error correction block code decoder 374.

Advantageously, the described approach can reduce latency in the receiver. The reason is that so long as the SNR and/or modulation and coding used on a link over which the described approach is employed are such that most of the time the hard bit decisions as verified by the error detector 380 can be used, that output will be available sooner compared to the conventional approach of waiting for the result of the full decoding.

In some embodiments, re-encoding the received set of source bits using the same error detection code used in the encoder to produce a set of error detection bits involves computing a checksum, such as a cyclic redundancy checks, on the received set of source bits.

In some embodiments, the received set of source bits is determined to be reliable when the received error detection bits are the same as the produced set of error detection bits. The set of source bits is determined not to be reliable when the received error detection bits are not the same as the produced set of error detection bits.

Figure 4A:
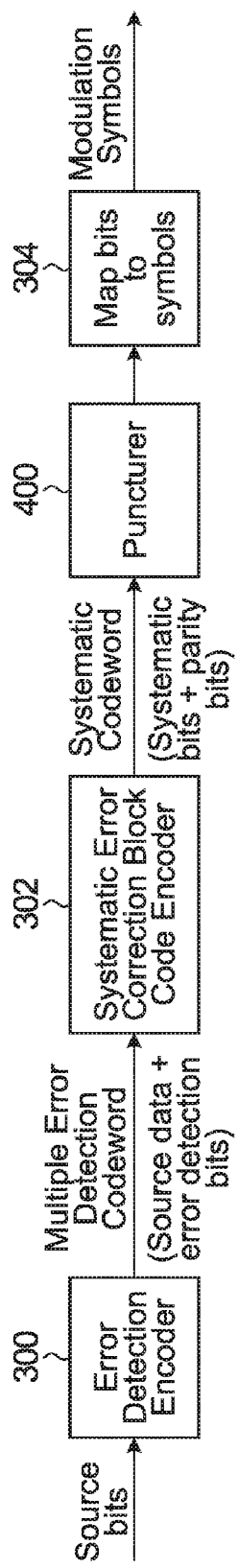
FIGS. 4A and 4B are encoding and decoding systems that are variants of the systems of FIGS. 3A and 3C.

FIG. 4A shows a variant of the encoding system of FIG. 3A. The FIG. 4A variant includes all of the components of FIG. 3A and also includes a puncturer 400. The puncturer 400 punctures the set of parity bits to produce a reduced set of parity bits. In this case, the mapper 304 maps all of the systematic code source bits and the reduced set of parity bits to modulation symbols.

Figure 4B:
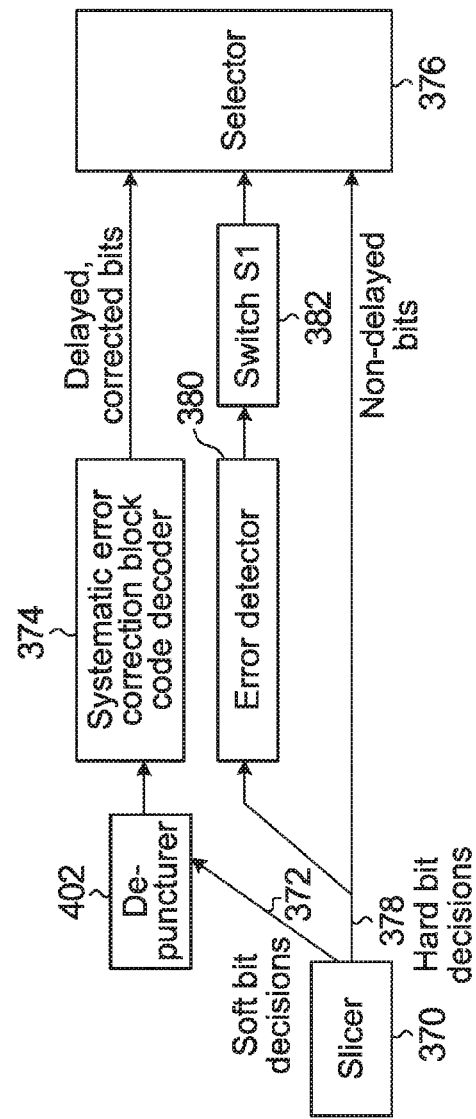

FIG. 4B shows a decoding system corresponding to the encoding system of FIG. 4A. The decoding system is a variant of the decoding system of FIG. 3C. The FIG. 4B variant includes all of the components of FIG. 3C and also includes a de-puncturer 402. As part of the first signal processing, the de-puncturer inserts soft decisions into the set of soft decisions output by the slicer 370 that corresponding to punctured parity bits. The inserted soft decisions indicate maximum uncertainty. For example, if the soft bit decisions are on a scale from −127 to +127, a "0" can indicate maximum uncertainty. The systematic error correction block code decoder 374 then operates based on the soft bit decisions including the inserted soft decisions.

Figure 5:
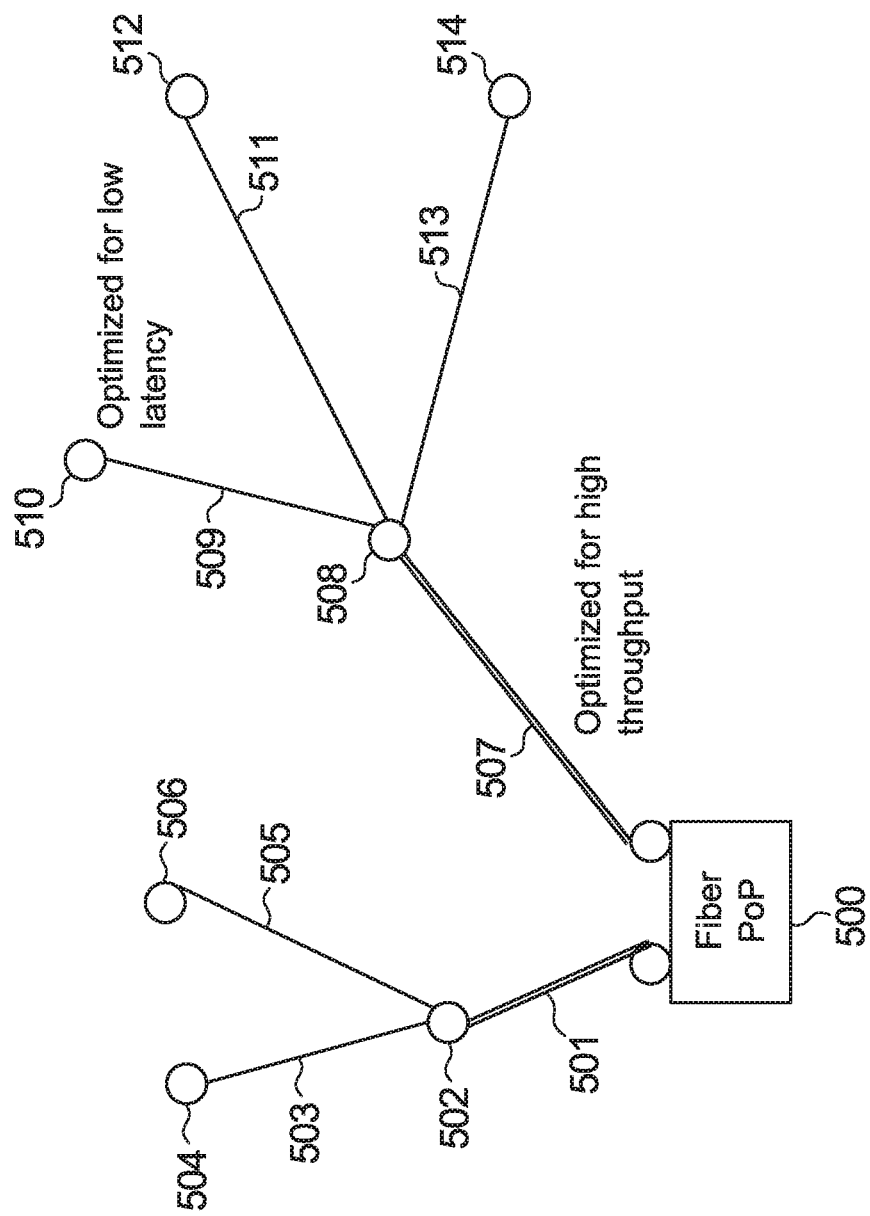
FIG. 5 is a block diagram of a software defined network provided by an embodiment of the invention.

In another embodiment, the lower latency encoding/decoding system described above is used in a network, such as a software defined network (SDN). An example will be described with reference to FIG. 5. Shown is a fiber point of presence (PoP) 500 which may for example be a fiber optic trunk. This is connected to an SDN composed of base stations 502, 504,506,508,510,512. The connections including an aggregate link 501 connecting the PoP 500 to base station 508, and dedicated links 503,505 connecting base station 508 to base stations 504,506 respectively. Similarly, there is an aggregate link 507 connecting the PoP 500 to base station 502, and dedicated links 509,511,513 connecting base station 502 to base stations 5010,512,514 respectively. The links might, for example, be microwave links. For links where the maximal throughput is not utilized, excess throughput can be substituted for lower latency. For example, in the FIG. 5 example, the aggregate links 501,507 likely need higher throughput than the dedicated links 503,505,509,511,513. Thus, the SDN can be configured with high throughput on the aggregate links 501,507 and with low latency on the dedicated links 503,505,509,511,513. The terms "high" and "low" as used here, are simply relative to the other link type. A "high throughput" link has higher throughput than a link that is not classified as "high throughput". A "low latency" link has lower latency than a link that is not classified as "low latency".

More generally, each link of a plurality of links in a software defined network is set to be in a low latency mode or a high throughput mode. Then, for each of the links that is in a low latency mode, the reduced latency encoding/decoding methods described herein are performed.

In some embodiments, for a given signal-to-noise ratio (SNR), a lower modulation is used for low latency mode than for high throughput mode. More generally, the SNR for low latency mode should be good enough to allow result of the hard slicing to be correct with a high probability. If the hard slicing is not successful, typically as a result of the SNR being too low or modulation level too high, the error detector will indicate an error and the decoder will wait for result of the error correction decoder.

In some embodiments, the SDN is configured to allow switching between low latency mode and high throughput on a link. In some embodiments, this configuration is made from time to time, for example, based on the required throughput of the link. In some embodiments, the configuration decision is made as part of overall SDN orchestration.

For example, when the link SNR is not good enough (as determined by a threshold for example), the link can be configured as a "high throughput" link, and the latency will be the regular LDPC latency. However, it is possible to switch over to low latency mode for the same SNR by using a lower adaptive coding and modulation.

For the described embodiments, the error correction code is an LDPC code. However, more generally, any systematic error correction block code can be used, including linear codes such as Reed-Solomon codes or BCH (Bose, Chaudhuri, and Hocquenghem) codes to name a few specific examples.

The error detection code can be a code that is designed strictly to detect errors such as checksum.

Figure 6:
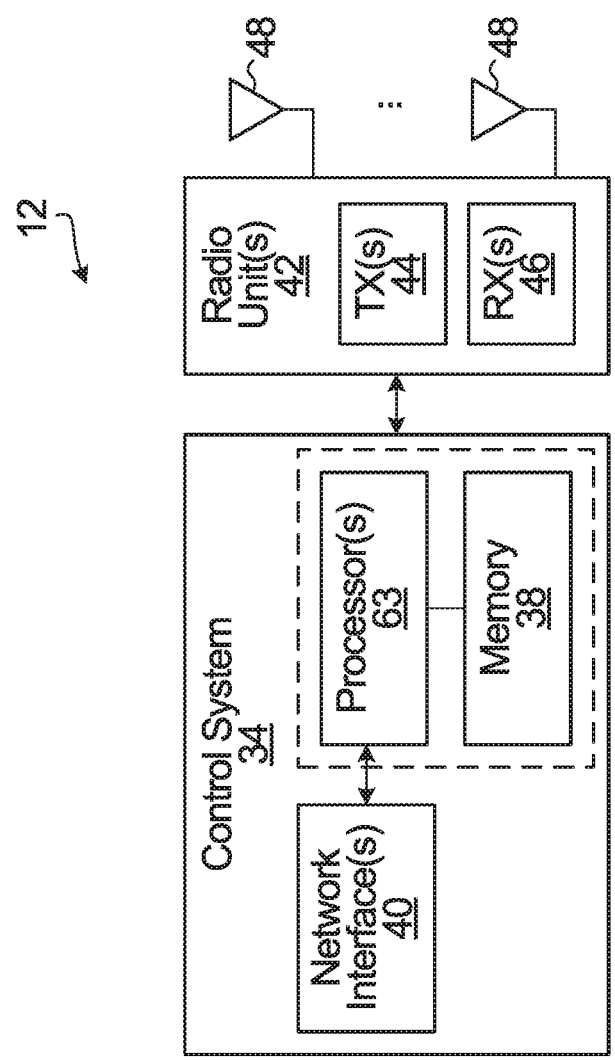
FIG. 6 is a block diagram of a base station.

FIG. 6 is a schematic block diagram of a base station 12 according to some embodiments of the present disclosure. As illustrated, the BS 12 includes a control system 34 configured to perform the encoding functions and/or he decoding functions described herein. In some implementations, the control system 34 is in the form of circuitry configured to perform the encoding and/or decoding functions. In yet other implementations, the control system or circuitry 34 includes one or more processors 36 (e.g., CPUs, ASICs, FPGAs, and/or the like) and memory 38 and possibly a network interface 40. The BS 12 also includes one or more radio units 42 that each includes one or more transmitters 44 and one or more receivers 46 coupled to one or more antennas 48. In some other implementations, the functionality of the BS 12 described herein may be fully or partially implemented in software or modules that is, e.g., stored in the memory 38 and executed by the processor(s) 36.

In yet other implementations, a computer program including instructions which, when executed by at least one processor, causes the at least one processor to carry out the functionality of the BS 12 according to any of the embodiments described herein is provided. In yet other implementations, a carrier containing the aforementioned computer program product is provided. The carrier is one of an electronic signal, an optical signal, a radio signal, or a computer readable storage medium (e.g., a non-transitory computer readable medium such as memory).

Figure 7:
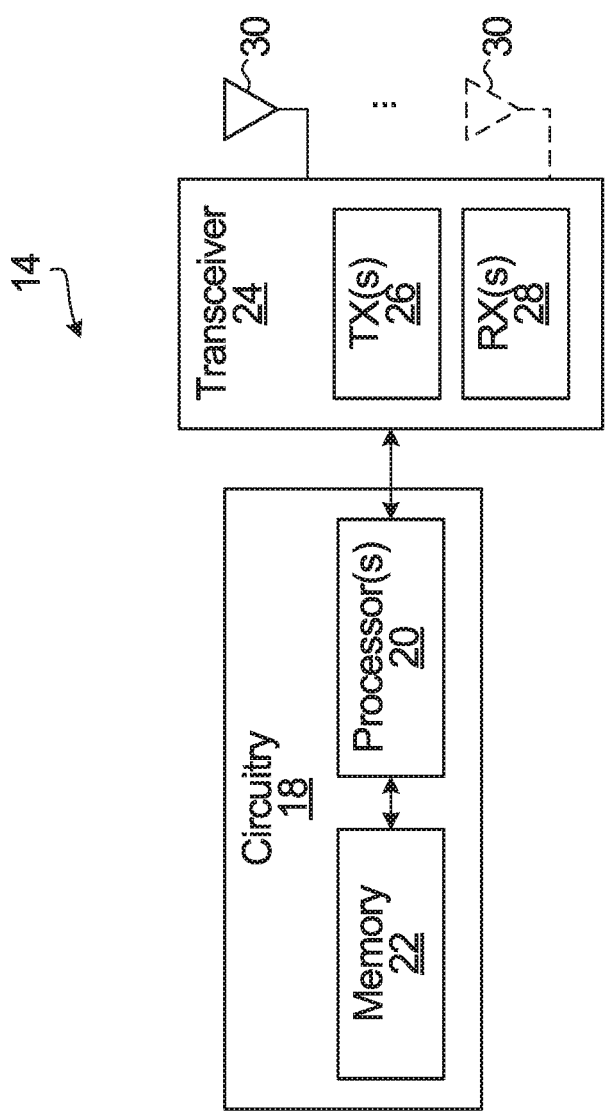
FIG. 7 is a block diagram of a wireless device.

FIG. 7 is a schematic block diagram of the wireless device 14 according to some embodiments of the present disclosure. As illustrated, the wireless device 14 includes circuitry 18 configured to perform the encoding functions and/or decoding functions described herein. In some implementations, the circuitry 18 includes one or more processors 20 (e.g., Central Processing Units (CPUs), Application Specific Integrated Circuits (ASICs), Field Programmable Gate Arrays (FPGAs), and/or the like) and memory 22. The wireless device 14 also includes one or more transceivers 24 each including one or more transmitter 26 and one or more receivers 28 coupled to one or more antennas 30. In some other implementations, the functionality of the wireless device 14 described herein may be fully or partially implemented in software or modules that is, e.g., stored in the memory 22 and executed by the processor(s) 20.

In yet other implementations, a computer program including instructions which, when executed by at least one processor, causes the at least one processor to carry out the functionality of the wireless device 14 according to any of the embodiments described herein is provided. In yet other implementations, a carrier containing the aforementioned computer program product is provided. The carrier is one of an electronic signal, an optical signal, a radio signal, or a computer readable storage medium (e.g., a non-transitory computer readable medium such as memory).

Figure 8:
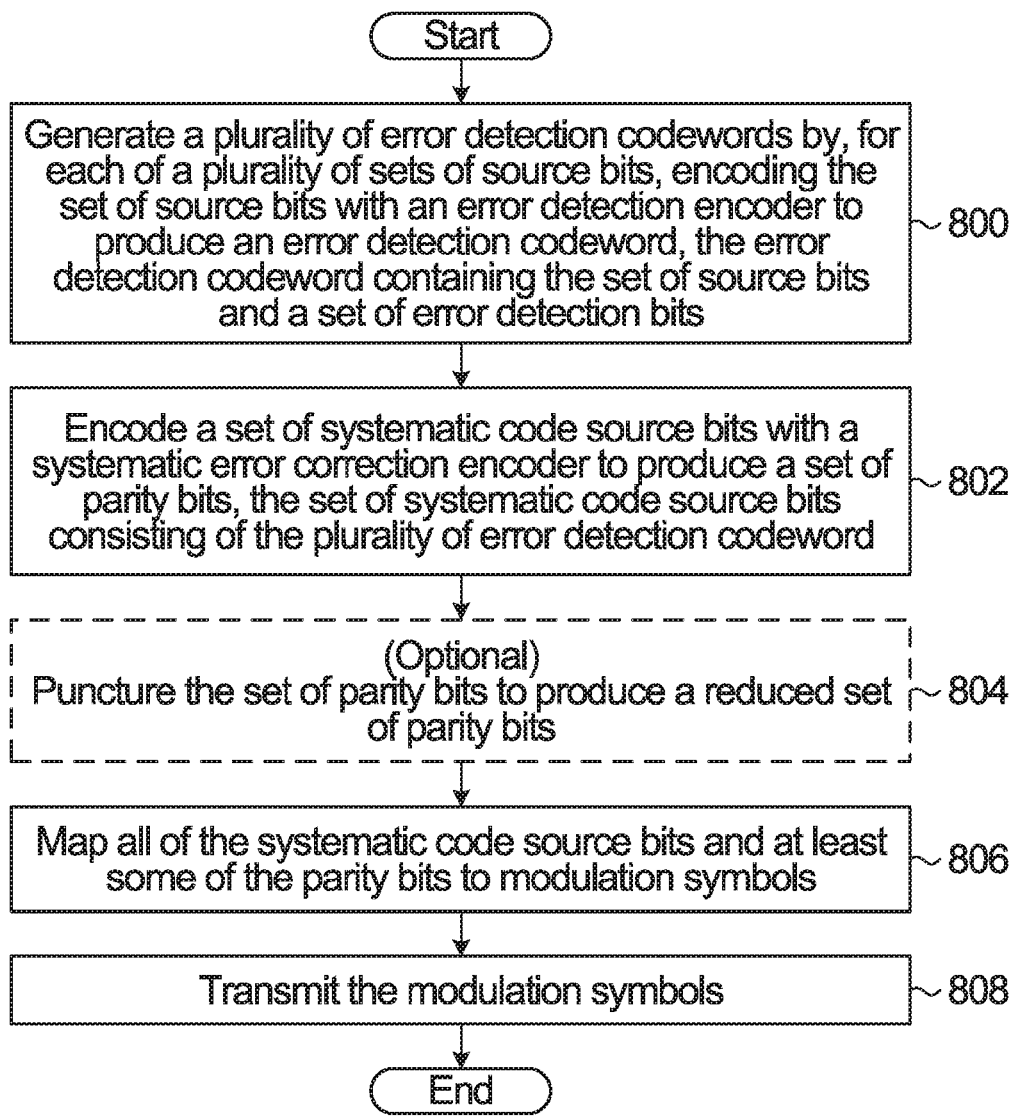
FIG. 8 is a flowchart of an encoding method provided by an embodiment of the invention.

FIG. 8 is a flowchart of an encoding method provided by an embodiment of the invention. The method begins in block 800 with generating a plurality of error detection codewords by, for each of a plurality of sets of source bits, encoding the set of source bits with an error detection encoder to produce an error detection codeword, the error detection codeword containing the set of source bits and a set of error detection bits. The method continues in block 802 with encoding a set of systematic code source bits with a systematic error correction encoder to produce a set of parity bits, the set of systematic code source bits consisting of the plurality of error detection codewords. Optionally, in block 804, the set of parity bits is punctured to produce a reduced set of parity bits. In block 806, all of the systematic code source bits and at least some of the parity bits are mapped to modulation symbols. In block 808, the modulation symbols are transmitted. When the puncturing step is included, wherein mapping all of the systematic code source bits and at least some of the parity bits to modulation symbols in block 806 involves mapping all of the systematic code source bits and the reduced set of parity bits to modulation symbols.

Figure 9:
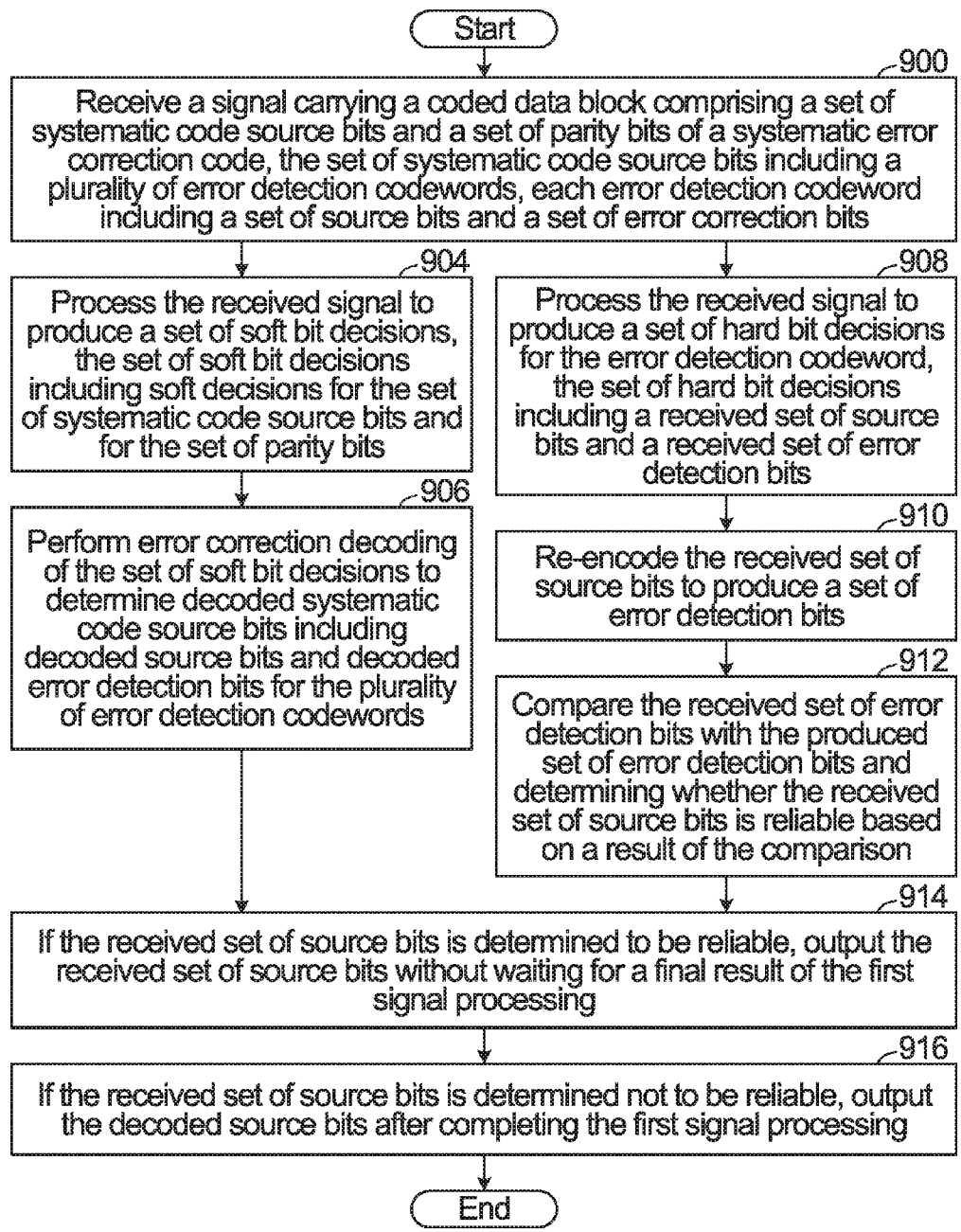
FIG. 9 is a flowchart of an encoding method provided by an embodiment of the invention.

FIG. 9 is a flowchart of a decoding method provided by an embodiment of the invention. The method begins in block 900 with receiving a signal carrying a coded data block comprising a set of systematic code source bits and a set of parity bits of a systematic error correction code, the set of systematic code source bits including a plurality of error detection codewords, each error detection codeword including a set of source bits and a set of error correction bits. A first signal processing is performed on the received signal by processing the received signal to produce a set of soft bit decisions, the set of soft bit decisions including soft decisions for the set of systematic code source bits and for the set of parity bits (block 904), and performing error correction decoding of the set of soft bit decisions to determine decoded systematic code source bits including decoded source bits and decoded error detection bits for the plurality of error detection codewords (block 906). In parallel with performing the first signal processing, a second signal processing on the received signal is performed by for each error detection codeword: processing the received signal to produce a set of hard bit decisions for the error detection codeword, the set of hard bit decisions including a received set of source bits and a received set of error detection bits (block 908), re-encoding the received set of source bits to produce a set of error detection bits (block 910), and comparing the received set of error detection bits with the produced set of error detection bits and determining whether the received set of source bits is reliable based on a result of the comparison (block 912). If the received set of source bits is determined to be reliable, the received set of source bits is output at block 914 without waiting for a final result of the first signal processing. If the received set of source bits is determined not to be reliable, the decoded source bits are output at block 916 after completing the first signal processing.

Numerous modifications and variations of the present disclosure are possible in light of the above teachings. It is therefore to be understood that within the scope of the appended claims, the disclosure may be practiced otherwise than as specifically described herein.

The invention claimed is:

1. A method comprising:
receiving a signal carrying a coded data block comprising a set of systematic code source bits and a set of parity bits of a systematic error correction code, the set of systematic code source bits including a plurality of error detection codewords, each error detection codeword including a set of source bits and a set of error detection bits;
performing a first signal processing on the received signal by:
processing the received signal to produce a set of soft bit decisions, the set of soft bit decisions including soft decisions for the set of systematic code source bits and for the set of parity bits;
performing error correction decoding of the set of soft bit decisions to determine decoded systematic code source bits including decoded source bits and decoded error detection bits for the plurality of error detection codewords;
in parallel with performing the first signal processing, performing a second signal processing on the received signal by:
for each error detection codeword:
processing the received signal to produce a set of hard bit decisions for the error detection codeword, the set of hard bit decisions including a received set of source bits and a received set of error detection bits;
re-encoding the received set of source bits to produce a set of error detection bits;
comparing the received set of error detection bits with the produced set of error detection bits;
determining the received set of source bits is reliable when the received error detection bits are the same as the produced set of error detection bits;
determining the received set of source bits is not reliable when the received error detection bits are not the same as the produced set of error detection bits;
outputting bits by:
outputting the received set of source bits without waiting for a final result of the first signal processing when the received set of source bits is determined to be reliable; and
outputting the decoded source bits after completing the first signal processing when the received set of source bits is determined not to be reliable.

2. The method of claim 1 wherein for each error detection codeword:
re-encoding the received set of source bits to produce a set of error detection bits comprises computing a checksum on the received set of source bits.

3. The method of claim 2 wherein computing a checksum comprises computing a cyclic redundancy checksum on the received set of source bits.

4. The method of claim 1 wherein performing error correction decoding comprises performing low density parity check (LDPC) decoding.

5. The method of claim 1 further comprising:
as part of the first signal processing, prior to performing error correction decoding, inserting soft decisions corresponding to punctured parity bits.

6. The method of claim 1 wherein the plurality of error detection codewords comprises at least 8 error detection codewords.

7. The method of claim 1, further comprising:
setting each link of a plurality of links in a software defined network to be in a first or second mode, wherein the first mode has a lower latency than the second mode and wherein the second mode has a higher throughput than the first mode, wherein at least one link is in the first mode;
wherein for each link that is set to be in the first mode performing said steps of:
receiving a signal, performing a first signal processing, in parallel with performing the first signal processing, performing a second signal processing, determining the received set of source bits is reliable, outputting bits.

8. The method of claim 7 further comprising:
for a given signal to noise ratio, using a lower modulation for the first mode than for the second mode.

9. A system comprising:
a receiver for receiving a signal carrying a coded data block comprising a set of systematic code source bits and a set of parity bits of a systematic error correction code, the set of systematic code source bits including a plurality of error detection codewords, each error detection codeword including a set of source bits and a set of error detection bits;

a first signal processor for performing a first signal processing on the received signal, the first signal processor comprising:
- a soft decision generator for processing the received signal to produce a set of soft bit decisions, the set of soft bit decisions including soft decisions for the set of systematic code source bits and for the set of parity bits;
- an error correction decoder for performing error correction decoding of the set of soft bit decisions to determine decoded systematic code source bits including decoded source bits and decoded error detection bits for the plurality of error detection codewords;

a second signal processor for performing a second signal processing on the received signal in parallel with said first signal processing, the second signal processor comprising:
- a hard decision generator for processing the received signal to produce a set of hard bit decisions for the error detection codeword, the set of hard bit decisions including for each error detection codeword a received set of source bits and a received set of error detection bits;
- an error detector that for each error detection codeword re-encodes the received set of source bits to produce a set of error detection bits, and that compares the received set of error detection bits with the produced set of error detection bits and determining whether the received set of source bits is reliable based on a result of the comparison;
- a selector that, when the received set of source bits is determined to be reliable, outputs the received set of source bits without waiting for a final result of the first signal processing, and that, when the received set of source bits is determined not to be reliable, outputs the decoded source bits after completing the first signal processing.

10. The system of claim 9 wherein the error correction block code decoder is a low density parity check (LDPC) decoder.

11. The system of claim 9 wherein the first signal processor further comprises:
- a depuncturer that, as part of the first signal processing, prior to performing error correction decoding, inserts soft decisions corresponding to punctured parity bits.

\* \* \* \* \*